US012772757B2

(12) United States Patent
Yong et al.

(10) Patent No.: US 12,772,757 B2
(45) Date of Patent: Oct. 20, 2026

(54) SUBSTRATE PROCESSING METHOD

(71) Applicant: ASM IP Holding B.V., Almere (NL)

(72) Inventors: SangHeon Yong, Yongin-si (KR); HongSuk Kim, Yongin-si (KR); SungHa Choi, Suwon-si (KR); JuHyuk Park, Hwaseong-si (KR); KiHun Kim, Yongin-si (KR); JiHye Yang, Ansan-si (KR)

(73) Assignee: ASM IP Holding B.V., Almere (NL)

( * ) Notice: Subject to any disclaimer, the term of this patent is extended or adjusted under 35 U.S.C. 154(b) by 518 days.

(21) Appl. No.: 18/238,063

(22) Filed: Aug. 25, 2023

(65) Prior Publication Data

US 2024/0071748 A1 Feb. 29, 2024

Related U.S. Application Data

(60) Provisional application No. 63/402,142, filed on Aug. 30, 2022.

(51) Int. Cl.

| | |
|---|---|
| ***H10P 14/60*** | (2026.01) |
| ***H01J 37/32*** | (2006.01) |
| ***H10P 14/69*** | (2026.01) |
| ***H10P 14/692*** | (2026.01) |
| ***H10P 14/694*** | (2026.01) |

(52) U.S. Cl.

CPC .... *H10P 14/6336* (2026.01); *H01J 37/32146* (2013.01); *H01J 37/32449* (2013.01); *H10P 14/6682* (2026.01); *H10P 14/6905* (2026.01); *H10P 14/69215* (2026.01); *H10P 14/6927* (2026.01); *H10P 14/69433* (2026.01); *H01J 2237/3321* (2013.01); *H01J 2237/3323* (2013.01)

(58) Field of Classification Search

CPC .................................................... C23C 16/345

See application file for complete search history.

(56) References Cited

U.S. PATENT DOCUMENTS

| | | | | |
|---|---|---|---|---|
| 2020/0013612 | A1* | 1/2020 | Blanquart | H10P 14/6339 |
| 2021/0384030 | A1* | 12/2021 | Blanquart | C23C 16/45542 |
| 2024/0071749 | A1* | 2/2024 | Yong | H10P 14/6339 |
| 2024/0222190 | A1* | 7/2024 | Blanquart | H01J 37/32449 |
| 2024/0258101 | A1* | 8/2024 | Yang | H10P 14/6308 |

* cited by examiner

*Primary Examiner* — Austin Murata

(74) *Attorney, Agent, or Firm* — Snell & Wilmer L.L.P.

(57) ABSTRACT

A substrate processing method includes providing, in a reaction space, a substrate including two gaps in a surface thereof, and filling the at least two gaps with a flowable film under a pulsed plasma atmosphere, while supplying a precursor and a reactant gas to the reaction space, wherein a difference of filling heights of the flowable film filled in the at least two gaps, between the at least two gaps, is reduced by adjusting a pulse frequency of pulsed plasma.

24 Claims, 17 Drawing Sheets

Continuous mode plasma

Pulsed mode plasma
(with high pulse frequency)

Pulsed mode plasma
(with low pulse frequency)

Pulsed mode plasma
(with low duty ratio and high pulse frequency)

Pulsed mode plasma
(with low duty ratio and low pulse frequency)

SUBSTRATE PROCESSING METHOD

CROSS-REFERENCE TO RELATED APPLICATIONS

This application claims priority to U.S. Provisional Patent Application Ser. No. 63/402,142 filed Aug. 30, 2022 titled SUBSTRATE PROCESSING METHOD, the disclosure of which is hereby incorporated by reference in its entirety.

BACKGROUND

1. Field

One or more embodiments relate to a substrate processing method, and more particularly, to a substrate processing method for forming a flowable film on a substrate having a surface on which pattern structures of various widths are formed.

2. Description of the Related Art

A gap-fill process is a technology widely used in a semiconductor manufacturing process, and for example, refers to a process of filling a gap in a pattern structure, such as shallow trench isolation (STI), with, for example, an insulating material. Meanwhile, with the increase in the degree of integration of semiconductor devices, an aspect ratio (A/R) of a gap in pattern structures is also rapidly increasing, and accordingly, there has been a demand to quickly fill a gap having a high A/R without a void (void-free). According to such demand, in order to quickly fill a gap having a high A/R without voids, a technology of using a flowable film as a filling material is known.

During each operation of a semiconductor manufacturing process, surface pattern structures of a substrate, which are stacked vertically, have various shapes. In other words, pattern structures exposed throughout an entire surface of the substrate have various heights vertically and have various widths horizontally. Generally, a gap is formed between the pattern structures, and according to some embodiments, the gap configures a circuit line width between the pattern structures. The width of the gap as the circuit line width, i.e., the smallest line width between the pattern structures, is referred to as a critical dimension (CD), and is present in various sizes. When a flowable film is formed on the substrate having the surface on which the pattern structures having various sizes of line widths are formed, flowability of the flowable film formed between the pattern structures, for example, in the gap between the pattern structures, according to the sizes of the line widths, varies according to the size of the gap. As a result, filling height uniformity of the flowable film between the gaps deteriorates, and thus it is difficult to efficiently adjust process variables.

Accordingly, when the flowable film is formed in the surface of the substrate, it is necessary to improve thickness uniformity of the flowable film even when the pattern structures having various sizes of line widths, for example, the gaps, are formed in the surface of the substrate.

SUMMARY

One or more embodiments include a substrate processing method, wherein a gap may be filled while improving filling height uniformity of a flowable film formed in the gap during a gap-fill process.

One or more embodiments include a substrate processing method, wherein a process time may be reduced by optimizing a target filling height of a flowable film filled in a gap during a gap-fill process.

Additional aspects will be set forth in part in the description which follows and, in part, will be apparent from the description, or may be learned by practice of the presented embodiments of the disclosure.

According to one or more embodiments, a substrate processing method includes providing, in a reaction space, a substrate having a surface on which a first gap and a second gap are formed, wherein the first gap has a first cross-sectional diameter in a horizontal direction and the second gap has a second cross-sectional diameter greater than the first cross-sectional diameter in the horizontal direction, and filling the first gap and the second gap with a flowable film under a pulsed plasma atmosphere, while supplying a precursor and a reactant gas to the reaction space, wherein the filling of the first gap and the second gap with the flowable film includes setting a reference pulse frequency that is an arbitrary reference of pulsed plasma, and filling the first gap and the second gap with the flowable film while supplying the pulsed plasma with an execution pulse frequency smaller than the reference pulse frequency. By performing the filling while supplying the pulsed plasma with the execution pulse frequency smaller than the reference pulse frequency, a filling height increase rate of the flowable film in the first gap may relatively increase and at the same time, a filling height increase rate of the flowable film in the second gap may relatively decrease so that a height difference between a filling height of the flowable film filled in the first gap and a filling height of the flowable film filled in the second gap is decreased.

By performing the filling while supplying the pulsed plasma with the execution pulse frequency smaller than the reference pulse frequency, a filling speed of the flowable film in the first gap may relatively increase and at the same time, a filling speed of the flowable film in the second gap may relatively decrease so that a difference between the filling speed of the flowable film filled in the first gap and the filling speed of the flowable film filled in the second gap is decreased. An internal volume of the first gap may be smaller than an internal volume of the second gap.

The execution pulse frequency may be within a range between about 0.5 KHz and about 100 KHz, and for example, within a range between about 1 KHz and about 10 KHz.

A duty ratio of the pulsed plasma may be within a range between about 1% and about 99%, and for example, within a range between about 10% and about 90%.

Vertical heights of the first gap and the second gap may be within a range between about 100 nm and about 5,000 nm. Horizontal widths of the first gap and the second gap may be within a range between about 50 nm and about 1,000 nm.

Magnitudes of the reference pulse frequency and the execution pulse frequency may be compared based on the pulsed plasma having a same duty ratio.

Pressure of the reaction space during the filling of the first gap and the second gap with the flowable film may be within a range from about 1 Torr to about 10 Torr, and the filling of the first gap and the second gap with the flowable film may be performed at a process temperature between about 0° C. and about 150° C.

The precursor supplied to the reaction space may include a silicon-containing precursor and the reactant gas may include a nitrogen-containing gas. The silicon precursor may include at least one of aminosilanes, iodosilanes, silicon halides, and an oligomer silicon (Si) source, or at least one of mixtures thereof.

According to one or more embodiments, a substrate processing method includes providing, in a reaction space, a substrate including two gaps on a surface thereof, and filling the at least two gaps with a flowable film under a pulsed plasma atmosphere, while supplying a precursor and a reactant gas to the reaction space, wherein a difference of filling heights of the flowable film filled in the at least two gaps, between the at least two gaps, is reduced by adjusting a pulse frequency of pulsed plasma.

The adjusting of the pulse frequency of the pulsed plasma may include setting a reference pulse frequency that is an arbitrary reference of the pulsed plasma, and setting an execution pulse frequency smaller than the reference pulse frequency, wherein the difference of the filling heights of the flowable film filled in the at least two gaps, between the at least two gaps, may be reduced while supplying the pulsed plasma with the execution pulse frequency.

The at least two gaps may include a first gap and a second gap, wherein the first gap has a first cross-sectional diameter in a horizontal direction and the second gap has a second cross-sectional diameter greater than the first cross-sectional diameter, in the horizontal direction, and by filling the at least two gaps with the flowable film while supplying the pulsed plasma with the execution pulse frequency, a filling height increase rate of the flowable film in the first gap may relatively increase and at the same time, a filling height increase rate of the flowable film in the second gap may relatively decrease so that a height difference between a filling height of the flowable film filled in the first gap and a filling height of the flowable film filled in the second gap is decreased.

The adjusting of the pulse frequency of the pulsed plasma may include setting a reference pulse frequency that is an arbitrary reference of the pulsed plasma, and setting an execution pulse frequency smaller than the reference pulse frequency, wherein a difference of filling speeds of the flowable film filled in the at least two gaps, between the at least two gaps, may be reduced while supplying the pulsed plasma with the execution pulse frequency.

The at least two gaps may include a first gap and a second gap, wherein the first gap has a first cross-sectional diameter in a horizontal direction and the second gap has a second cross-sectional diameter greater than the first cross-sectional diameter, in the horizontal direction, and by filling the at least two gaps with the flowable film while supplying the pulsed plasma with the execution pulse frequency, a filling speed of the flowable film in the first gap may relatively increase and at the same time, a filling speed of the flowable film in the second gap may relatively decrease so that a filling speed difference between the filling speed of the flowable film filled in the first gap and the filling speed of the flowable film filled in the second gap is decreased. An internal volume of the first gap may be smaller than an internal volume of the second gap.

The execution pulse frequency may be within a range between about 0.5 KHz and about 100 KHz, and for example, within a range between about 1 KHz and about 10 KHz.

A duty ratio of the pulsed plasma may be within a range between about 1% and about 99%, and for example, within a range between about 10% and about 90%.

Vertical heights of the at least two gaps may be within a range between about 100 nm and about 5,000 nm. Horizontal widths of the at least two gaps are within a range between about 50 nm and about 1,000 nm.

Magnitudes of the reference pulse frequency and the execution pulse frequency may be compared based on the pulsed plasma having a same duty ratio.

Pressure of the reaction space during the filling of the first gap and the second gap with the flowable film may be within a range from about 1 Torr to about 10 Torr, and the filling of the first gap and the second gap with the flowable film may be performed at a process temperature between about 0° C. and about 150° C.

The precursor supplied to the reaction space may be a silicon-containing precursor and the reactant gas may be a nitrogen-containing gas.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
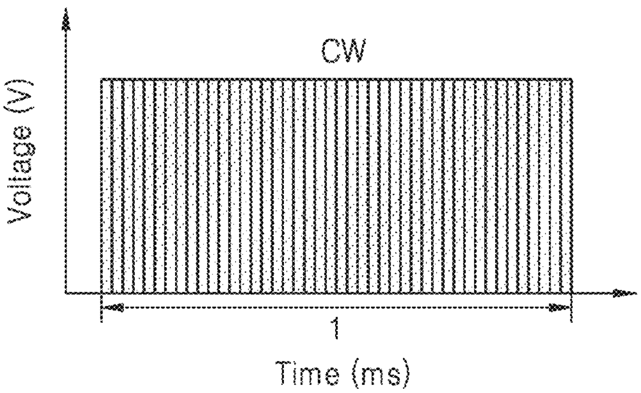
FIG. 1 is a schematic diagram for describing continuous mode plasma used in a plasma enhanced chemical vapor deposition (PECVD) process.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described in detail with reference to the accompanying drawings.

Embodiments of the disclosure are provided to further fully describe the disclosure to one of ordinary skill in the art. The embodiments may be embodied in many different forms and the scope of the disclosure is not limited to those embodiments. Rather, these embodiments are provided so that the disclosure will be thorough and complete, and will fully convey the concept of the disclosure to one of ordinary skill in the art.

Terms used herein are intended to describe embodiments and are not intended to limit the disclosure. As used herein, the singular forms "a", "an", and "the" are intended to include the plural forms as well, unless the context clearly indicates otherwise. When used in the present specification, the terms "comprises" and/or "comprising" specify the presence of stated shapes, numbers, steps, operations, members, components, and/or groups thereof, but do not preclude the presence or addition of one or more other shapes, numbers, operations, members, components, and/or groups. Expressions such as "at least one of," when preceding a list of elements, modify the entire list of elements and do not modify the individual elements of the list.

It will be understood that although the terms "first", "second", etc. may be used herein to describe various members, regions, and/or parts, these members, components, regions, layers, and/or parts should not be limited by these terms. These terms do not indicate a specific order, superiority and inferiority, or merits and demerits, and are only used to distinguish one member, region, or part from another. Accordingly, a first member, region, or part described below may refer to a second member, region, or part without departing from the scope of the disclosure.

Hereinafter, embodiments of the disclosure will be described with reference to the drawings schematically showing ideal embodiments of the disclosure. In the drawings, for example, modifications of shapes may be expected according to manufacturing technology and/or tolerance. Thus, embodiment of the disclosure should not be interpreted as being limited by a specific shape of a region shown in the present specification, and for example, should include a change in the shape caused by manufacture.

The disclosure basically relates to a gap-fill process performed by depositing a flowable film in a gap by using a plasma enhanced chemical vapor deposition (PECVD) method.

Plasma is widely used in a process of manufacturing a semiconductor device, and a specific material may be deposited on a surface of a substrate or a specific material may be etched from the substrate by using ions, reactive gases, or radicals generated by plasma. A plasma reaction apparatus may use continuous mode plasma in which plasma is generated in a reaction chamber by continuously applying a radio frequency (RF) voltage to a plasma source (e.g. showerhead electrode) for generating plasma, and continuous waves to induce ions to a substrate are formed by applying a direct current (DC) bias to a bias electrode region where the substrate is placed (e.g. heating block). Alternatively, the plasma reaction apparatus may use pulsed mode plasma in which pulsed waves are formed by applying, as a pulse, RF power to the plasma source or bias electrode region, and pulsed plasma is generated in a reaction space accordingly.

FIG. 1 is a schematic diagram for describing continuous mode plasma used in a PECVD process. Referring to FIG. 1, in the continuous mode plasma, an RF voltage applied to a reaction chamber maintains a uniform value without being cut off, according to a lapse of time. In FIG. 1, a section "1" denotes a section where RF power is turned on. As continuous mode plasma is applied to the reaction chamber, a process may be performed under a relatively stable plasma atmosphere in the reaction chamber.

Figure 2:
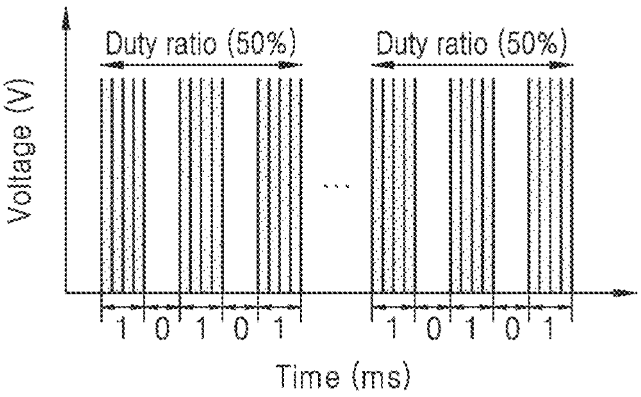
FIG. 2 is a schematic diagram for describing pulsed mode plasma with a relatively high pulse frequency used in a PECVD process.

FIG. 2 is a schematic diagram of pulsed plasma with a relatively high pulse frequency used in a PECVD process. FIG. 2 is a diagram for describing an example of pulsed mode plasma different from the continuous mode plasma of FIG. 1.

As described above, in the pulsed mode plasma, a plasma reaction apparatus forms pulsed waves of RF power by pulsing the RF power applied to a plasma source (e.g. showerhead plate) or bias electrode region (e.g. heating block), and forms pulsed plasma in a reaction space accordingly. According to the pulsed mode plasma, generation and extinction of plasma are repeated by adjusting a plasma-on period and a plasma-off period, thereby precisely controlling a plasma characteristic to be suitable according to a process characteristic.

FIG. 2 is a diagram for describing pulsed plasma with a relatively high pulse frequency, and a section "1" denotes a section where the RF power is turned on and a section "0" denotes a section where the RF power is turned off. Also, in FIG. 2, one on-section (i.e., the section "1") may be set to have an RF pulse frequency of about 0.5 KHz to about 100 KHz, for example, an RF pulse frequency of about 0.5 KHz to about 10 KHz, and for example, an RF pulse frequency of about 5 KHz. For example, such a numerical value may be set as an arbitrary reference pulse frequency in a gap-fill process of a flowable film using a PECVD process, in a substrate processing method according to embodiments of the disclosure. The reference pulse frequency may vary depending on a process condition (for example, the reference pulse frequency may be greater than or smaller than 5 KHz).

In FIG. 2, a duty ratio is set to 50%. The duty ratio indicates an operation ratio of pulsed plasma, and denotes a ratio of an on-section to an off-section of the pulsed plasma. Accordingly, for example, when the duty ratio is 50%, the on-section of pulsed plasma is 50% and the off-section thereof is 50% when one cycle of pulse is 100%. When, for example, the duty ratio is 30%, the on-section of pulsed plasma is 30% and the off-section thereof is 70% when one cycle of pulse is 100%. According to an embodiment of the disclosure, the duty ratio may be in a range between 1% and 99%.

Figure 3:
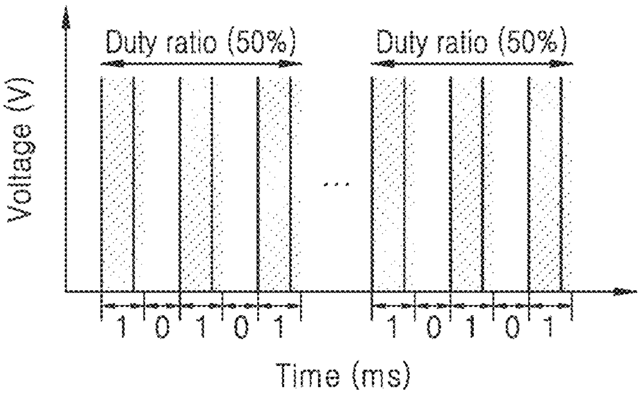
FIG. 3 is a schematic diagram for describing pulsed mode plasma with a relatively low pulse frequency used in a PECVD process.

FIG. 3 is a schematic diagram of pulsed plasma with a relatively low pulse frequency used in a PECVD process. FIG. 3 is a diagram for describing another example of pulsed mode plasma.

FIG. 3 is a diagram for describing a pulsed plasma with a relatively low pulse frequency, and a section "1" denotes a section where the RF power is turned on and a section "0" denotes a section where the RF power is turned off. Also, in FIG. 3, one on-section (i.e., the section "1") may be set to have an RF pulse frequency of about 0.5 KHz to about 100 KHz, and for example, an RF pulse frequency of about 2 KHz to be clearly distinguished from the high pulse frequency of FIG. 2. Meanwhile, such a numerical value may also be set as another arbitrary reference pulse frequency in a gap-fill process of a flowable film using a PECVD process, in a substrate processing method according to other embodiments of the disclosure.

In FIG. 3, a duty ratio is set to 50%. When the duty ratio is 50%, an on-section of pulsed plasma is 50% and an off-section thereof is 50% when one cycle of pulse is 100%, as described above. Comparing FIGS. 2 and 3, the duty ratios are set to 50% in both FIGS. 2 and 3, and FIGS. 2 and 3 are only different in that the pulse frequencies of pulsed plasma are 5 KHz and 2 KHz, respectively.

Figure 4A:
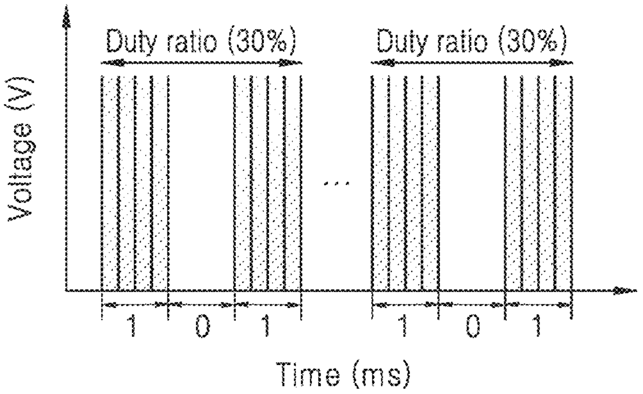
FIG. 4A is a schematic diagram for describing pulsed mode plasma with a relatively low duty ratio and high pulse frequency used in a PECVD process.

FIG. 4A is a schematic diagram for describing a pulsed mode plasma with a relatively low duty ratio and high pulse frequency used in a PECVD process. Comparing FIG. 4A with FIGS. 2 and 3, a duty ratio is decreased from 50% to 30%, and a pulse frequency is the same as the high pulse frequency of FIG. 2, for example, 5 KHz.

Figure 4B:
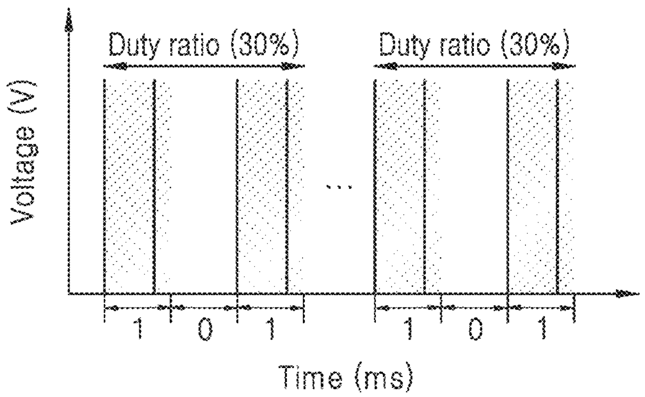
FIG. 4B is a schematic diagram for describing pulsed mode plasma with a relatively low duty ratio and low pulse frequency used in a PECVD process.

FIG. 4B is a schematic diagram for describing a pulsed mode plasma with a relatively low duty ratio and low pulse frequency used in a PECVD process. Comparing FIG. 4B with FIGS. 2 and 3, a duty ratio is decreased from 50% to 30%, and a pulse frequency is the same as the low pulse frequency of FIG. 3, for example, 2 KHz.

Figure 5A:
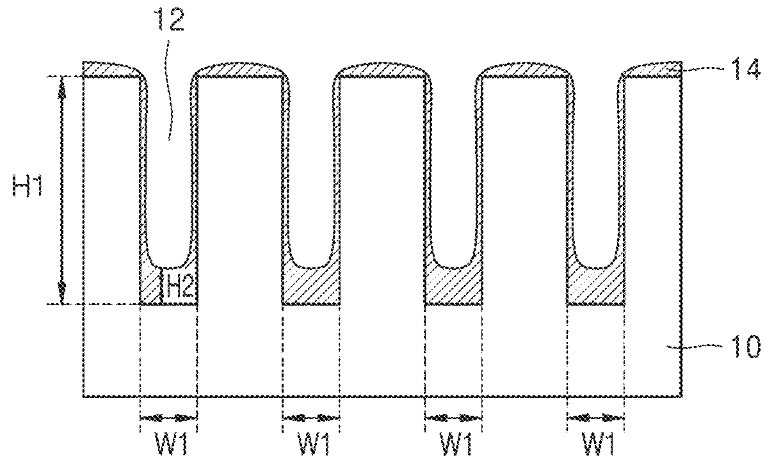
FIGS. 5A and 5B are cross-sectional views schematically showing a process of filling gaps having the same size with a flowable film.
Figure 5B:
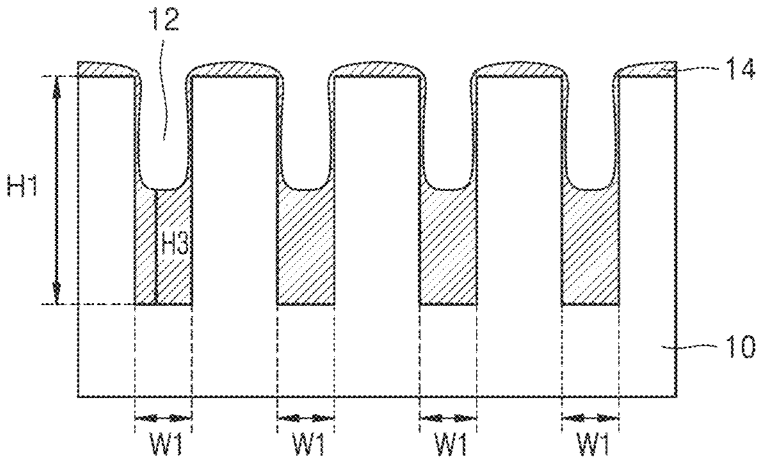

Hereinafter, a substrate processing method of performing a gap-fill process of filling gaps on a substrate with a flowable film, for example, a silicon nitride film, according to a flowable chemical vapor deposition method, according to embodiments of the disclosure, will be described. FIGS. 5A and 5B are cross-sectional views schematically showing a process of filling gaps with a flowable film, according to embodiments of the disclosure. FIGS. 5A and 5B schematically illustrate a process of filling a plurality of gaps having a same size, for example, having a same width in a horizontal direction and a same depth in a vertical direction on a substrate, with a flowable film.

Referring to FIG. 5A, a substrate 10 provided in a reaction space (not shown) where a gap-fill process is to be performed is illustrated. A gap structure including gaps 12 having a specific vertical depth H1 in a vertical direction and a specific horizontal width W1 in a horizontal direction in a partial region of a surface of the substrate 10 is illustrated. In FIG. 5A, for example, the plurality of gaps 12 formed on the surface of the substrate 10 are illustrated to have the same horizontal width W1 in the horizontal direction and the same vertical depth H1 in the vertical direction.

Then, referring to FIG. 5A, when a silicon precursor and a reactant gas are supplied to the reaction space while applying RF power, a plasma atmosphere is formed in the reaction space, and a flowable film 14, such as silicon nitride, is deposited on an exposed surface of the substrate 10 including the gaps 12, through condensation, oligomerization, and polymerization between the silicon precursor and the reactant gas under the plasma atmosphere.

According to embodiments of the disclosure, the RF power applied to the reaction space is pulsed and supplied to the reaction space as pulsed plasma in a pulsed wave form. Meanwhile, according to embodiments of the disclosure, the pulsed plasma supplied to the reaction space is supplied at a pulse frequency smaller than an arbitrary reference pulse frequency set according to process requirements. In other words, for example, when the reference pulse frequency is set to 5 KHz as shown in FIG. 2, an execution pulse frequency at which a pulsed plasma process is executed according to embodiments of the disclosure may be smaller than 5 KHz. Also, for example, when the reference pulse frequency is set to 2 KHz as shown in FIG. 3, the execution pulse frequency at which the pulsed plasma process is executed according to embodiments of the disclosure may be smaller than 2 KHz.

Continuously referring to FIG. 5A, the flowable film 14 flows down from an upper region of the gap 12 towards a lower region of the gap 12 according to the flowability of the flowable film 14, and accordingly, the width of an internal space formed inside the gap 12 between portions of the flowable film 14 becomes smaller in the lower region of the gap 12 than in the upper region of the gap 12. As described above, because the gaps 12 formed on the surface of the substrate 10 have the same horizontal width W1 in the horizontal direction and the same vertical depth H1 in the vertical direction, the flowable film 14 is filled inside the gaps 12 at an approximately same filling speed while having an approximately same shape. In FIG. 5A, a reference numeral H2 denotes a distance from a bottom surface of the gap 12 to the lowest upper surface of the flowable film 14 in the vertical direction, and may be defined as a filling height of the flowable film 14.

Referring to FIG. 5B, as the gap-fill process progresses further, the flowable film 14 is deposited while further flowing down from the upper region of the gap 12 towards the lower region of the gap 12, and thus the width of the internal space formed inside the gap 12 between portions of the flowable film 14 becomes further smaller in the lower region of the gap 12 than in the upper region of the gap 12, and the filling height of the flowable film 14 filled from the bottom surface of the gap 12 is also increased (H3>H2). Then, when the gap-fill process further progresses and a sufficient time passes, the gaps 12 may be completely filled by the flowable film 14.

Figure 6A:
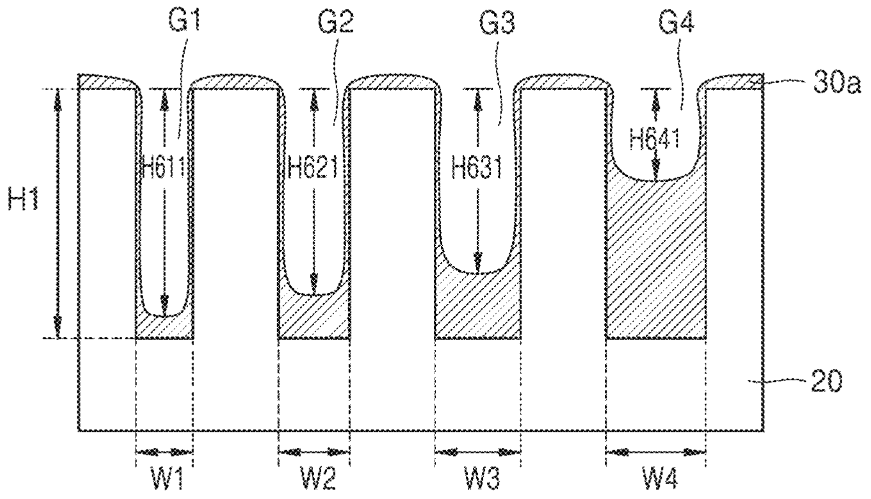
FIGS. 6A and 6B are cross-sectional views schematically showing a process of filling gaps having different sizes with a flowable film by using continuous plasma.
Figure 6B:
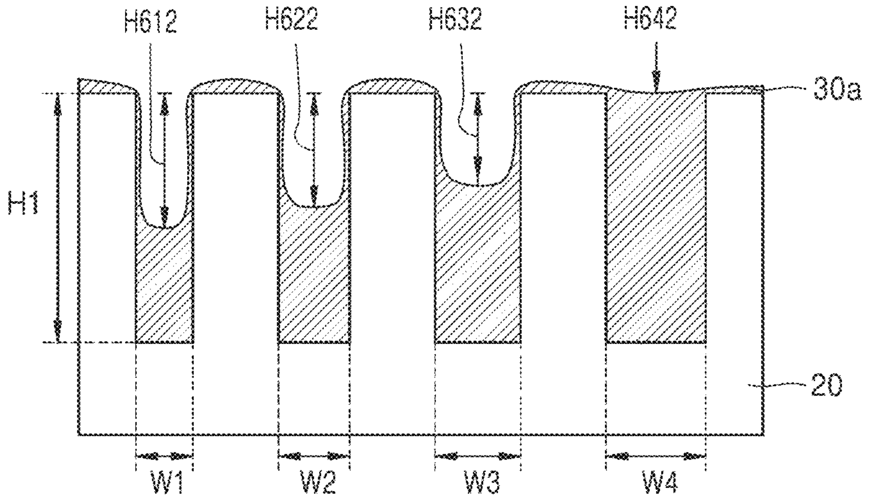

FIGS. 6A and 6B are cross-sectional views schematically showing a process of filling a gap with a flowable film by PECVD process using a continuous mode wave plasma, in comparison with embodiments of the disclosure. FIGS. 6A and 6B schematically illustrate a process of filling a plurality of gaps having different widths in a horizontal direction and a same depth in a vertical direction on a substrate, with a flowable film, for convenience of descriptions.

Referring to FIG. 6A, a substrate 20 provided to a reaction space (not shown) where a gap-fill process is to be performed is illustrated. A gap structure including a plurality of gaps G1, G2, G3, and G4 having a same vertical depth H1 in a vertical direction and different horizontal widths W1, W2, W3, and W4 in a horizontal direction in a partial region of a surface of the substrate 20 is illustrated. In FIG. 6A, for example, the horizontal widths W1, W2, W3, and W4 of the plurality of gaps G1, G2, G3, and G4 formed on the surface of the substrate 20 gradually increase in a rightward direction of FIG. 6A, for convenience of descriptions (i.e., W1<W2<W3<W4).

Then, referring to FIG. 6A, when a silicon precursor and a reactant gas are supplied to the reaction space while applying RF power, a plasma atmosphere is formed in the reaction space, and a film having flowability, for example, a flowable film 30*a*, such as silicon nitride, is deposited on an exposed surface of the substrate 20 including the gaps G1, G2, G3, and G4, through condensation, oligomerization, and polymerization between the silicon precursor and the reactant gas under the plasma atmosphere. Here, the RF power applied to the reaction space is in a form of continuous mode waves as shown in FIG. 1, and thus continuous plasma is generated in the reaction space. According to example embodiments of the present disclosure, a film to be deposited on an exposed surface of a substrate to be processed, including on a gap to be filled, may include at least one of silicon oxide ($SiO_2$), silicon nitride ($Si_x N_y$), silicon oxynitride (SiON), silicon carbonitride (SiCN) and mixture thereof.

Continuously referring to FIG. 6A, the flowable film 30*a* flows down from upper regions of the gaps G1, G2, G3, and G4 towards lower regions of the gaps G1, G2, G3, and G4 according to the flowability of the flowable film 30*a*, and fills the gaps G1, G2, G3, and G4 from bottom surfaces of the gaps G1, G2, G3, and G4 in a bottom-up manner. Meanwhile, as described above, because the horizontal widths W1, W2, W3, and W4 of the gaps G1, G2, G3, and G4 formed on the surface of the substrate 20 gradually increase (i.e., W1<W2<W3<W4), filling heights of the flowable film 30*a* formed in the gaps G1, G2, G3, and G4 may increase from the gap G1 to the gap G4 (i.e., (H1-H611)<(H1-H621)<(H1-H631)<(H1-H641)).

Referring to FIG. 6B, as the gap-fill process further progresses, the flowable film 30*a* further flows down from upper regions of the gaps G1, G2, G3, and G4 towards lower regions of the gaps G1, G2, G3, and G4, and fills the gaps G1, G2, G3, and G4 from the bottom surfaces of the gaps G1, G2, G3, and G4 in the bottom-up manner. Meanwhile, as described above, because the horizontal widths W1, W2, W3, and W4 of the gaps G1, G2, G3, and G4 formed on the surface of the substrate 20 gradually increase (i.e., W1<W2<W3<W4), the filling heights of the flowable film 30*a* formed in the gaps G1, G2, G3, and G4 are still different and may increase from the gap G1 to the gap G4 (i.e., (H1-H612)<(H1-H622)<(H1-H632)<(H1-H642)). Then, when the gap-fill process further progresses and a sufficient time passes, the gaps G1, G2, G3, and G4 may be completely filled by the flowable film 30*a* in the order from the gap with the largest horizontal width, i.e., in the order from the highest filling height of the flowable film 30*a*.

Referring to FIGS. 6A and 6B, when the gap-fill process is performed by using a flowable film under a continuous plasma atmosphere, as shown in FIG. 1, on a gap structure including a plurality of gaps having different sizes, for example, different widths in a horizontal direction, for example, different cross-sectional diameters in the horizontal direction, or for example, different internal volumes, filling heights of the flowable film filled in the gaps may have large differences depending on the sizes of the gaps. In particular, in FIG. 6A, a filling height difference of the flowable film 30*a* between the gap G1 and the gap G4 may be {(H1-H641)−(H1-H611)}, and in FIG. 6B, the filling height difference of the flowable film 30*a* between the gap G1 and the gap G4 may be {(H1-H642)−(H1-H612)}.

Accordingly, for example, when ending of the gap-fill process is set based on a filling height of a gap having a relatively large cross-sectional diameter, a filling height difference between a gap having the largest cross-sectional diameter and a gap having the smallest cross-sectional diameter is relatively big, and thus the gap-fill process is continuously performed until the gap having the smallest cross-sectional diameter is filled. Thus, a gap-fill process time may increase by a time corresponding to the difference (a time during which the gap having the smallest cross-sectional diameter is filled—a time during which the gap having the largest cross-sectional diameter is filled). Similarly, for example, when the ending of the gap-fill process is set based on a filling speed in a gap having a relatively large internal volume, a filling speed difference between a gap having the largest internal volume and a gap having the smallest internal volume is relatively big, and thus the gap-fill process time may increase by a time corresponding to the filling speed difference. Also, with the increase in the gap-fill process time, excessive deposition of a flowable film as a gap-fill material may increase around the gap having the largest cross-sectional diameter or largest internal volume, and accordingly, a time for a surface planarization process, such as an etch-back or chemical mechanical polishing process, performed subsequently may increase correspondingly, and moreover, consumption of the flowable film that is excessively deposited may increase.

Next, according to embodiments of the disclosure, for example, a process of filling a gap with a flowable film by PECVD process using a pulsed mode plasma with respect to a gap structure including a plurality of gaps having different sizes, for example, different widths in a horizontal direction, for example, different cross-sectional diameters in the horizontal direction, or for example, different internal volumes, will be described.

Figure 7A:
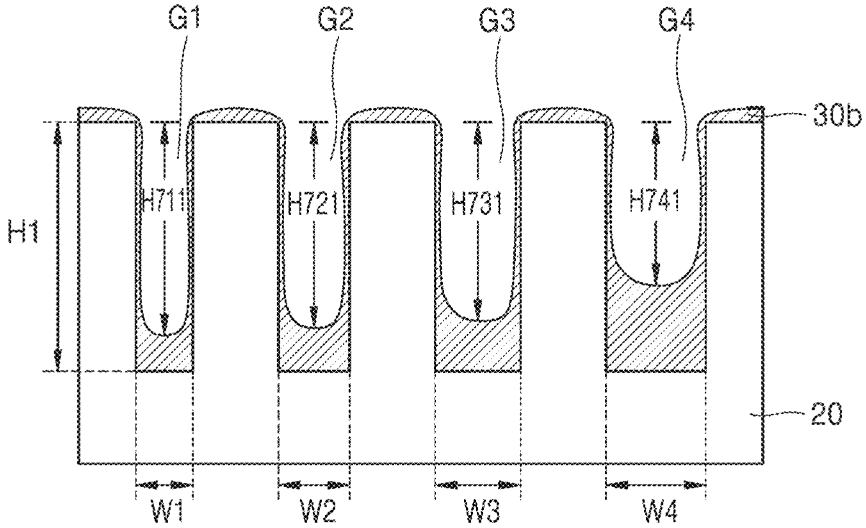
FIGS. 7A and 7B are cross-sectional views schematically showing a process of filling gaps having different sizes with a flowable film by using pulsed plasma with a relatively high pulse frequency.
Figure 7B:
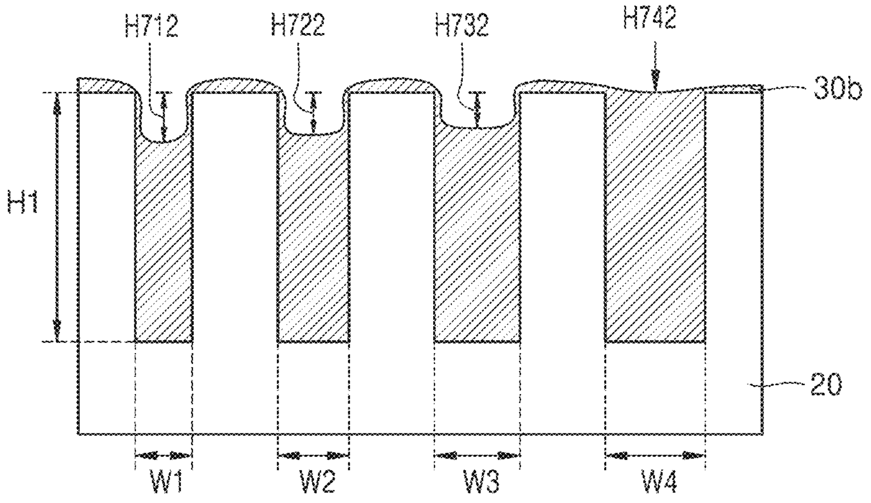

FIGS. 7A and 7B are cross-sectional views schematically showing a process of filling gaps with a flowable film by using a pulsed plasma with a relatively high pulse frequency. Here, the “relatively high pulse frequency” may have a relative meaning. In detail, embodiments of FIGS. 7A and 7B are for describing an operation of performing a gap-fill process by using a pulsed plasma having the relatively high pulse frequency of FIG. 2. However, the high pulse frequency of FIG. 2 may be a high pulse frequency greater than or a low pulse frequency smaller than an arbitrary reference pulse frequency that may be set according to a process requirement in a flowable film gap-fill process according to embodiments of the disclosure. In the present embodiment, for convenience of descriptions, under a premise of pulsed plasma having a same duty ratio (for example, a duty ratio of 50%), the pulse frequency (for example, 5 KHz) of FIG. 2 having a relatively high pulse frequency compared to the pulse frequency (for example, 2 KHz) of FIG. 3 may be assumed as the “relatively high pulse frequency” to describe the gap-fill process using a flowable film.

Referring to FIG. 7A, the substrate 20 provided to a reaction space (not shown) where the gap-fill process is to be performed is illustrated. The gap structure including the plurality of gaps G1, G2, G3, and G4 having the same vertical depth H1 in a vertical direction and the different horizontal widths W1, W2, W3, and W4 in the horizontal direction in a partial region of a surface of the substrate 20 is illustrated. In FIG. 7A, for example, the horizontal widths W1, W2, W3, and W4 of the plurality of gaps G1, G2, G3, and G4 formed on the surface of the substrate 20 gradually increase, for convenience of descriptions (i.e., W1<W2<W3<W4). In the gap-fill process according to embodiments of the disclosure, the vertical depth H1 of the gap G1, G2, G3, or G4 may be within a range from about hundreds of nm to about thousands of nm, for example, from about 100 nm to about 5,000 nm, for example, from about 1,000 nm to about 5,000 nm, for example, from about 2,000 nm to about 5,000 nm, and for example, from about 2,500 nm to about 5,000 nm. Also, the horizontal width W1, W2, W3, or W4 of the gap G1, G2, G3, or G4 may be within a range from about tens of nm to about thousands of nm, for example, from about 50 nm to about 1,000 nm, for example, from about 100 nm to about 500 nm, and for example, from about 200 nm to about 500 nm.

A semiconductor integrated circuit has vertically various pattern structures and shapes. Such pattern structures include a semiconductor layer, a conductive layer, and/or an insulating layer, and are vertically stacked in various methods to configure electric circuits. Accordingly, a surface of a substrate has the various pattern structures during each operation of manufacturing the semiconductor integrated circuit, and FIG. 7A representatively schematically illustrates a gap structure among the various pattern structures. For example, the gaps G1 through G4 are illustrated to have a same vertical depth H1 but different horizontal widths W1, W2, W3, and W4 in the horizontal direction. In practice, the pattern structures stacked vertically during a process of manufacturing the semiconductor integrated circuit have various shapes. In particular, gaps in the various pattern structures may have various shapes, for example, various widths in the horizontal direction, various depths in the vertical direction, various internal volumes, various vertical profiles at side walls, or various surface cross-section shapes. In the present embodiments, for convenience of descriptions and easy understanding, a gap-fill process of the disclosure is applied to the plurality of gaps G1 through G4 having the same vertical depth H1 and the various horizontal widths W1 through W4 (i.e., $W1<W2<W3<W4$).

In FIG. 7A, sizes of the horizontal widths W1 through W4 of the gaps G1 through G4 are $W1<W2<W3<W4$, i.e., the horizontal widths W1 through W4 increase from the gap G1 to the gap G4. Also, it is assumed that the gaps G1 through G4 may have a same shape, for example, a cylindrical shape. In other words, as shown in FIG. 7A, the gaps G1 through G4 have the same vertical depth H1, have a circular cross-section in the horizontal direction, and have vertical profiles perpendicular to horizontal surfaces, and only the horizontal widths W1 through W4, for example, cross-sectional diameters in the horizontal direction, increase from the gap G1 to the gap G4. In this regard, the internal volumes of the gaps G1 through G4 may also increase from the gap G1 to the gap G4.

Referring to FIG. 7A, the substrate 20 may include a semiconductor material, such as silicon (Si) or germanium (Ge), or may include any one of various compound semiconductor materials, such as SiGe, silicon carbide (SiC), gallium arsenide (GaAs), indium arsenide (InAs), and indium phosphide (InP), and may include any one of various substrates used for a display device, a semiconductor device, and the like, such as silicon-on-insulator (SOI) and silicon-on-sapphire (SOS). In other words, the substrate 20 may include any substrate having a surface on which various pattern structures are formed and on which a gap-fill process may be performed.

The gaps G1 through G4 used in the disclosure indicate one of pattern structures in the widest meaning. The gaps G1 through G4 may refer to uniform spaces in which at least top sides thereof are exposed by surrounding pattern structures defining the gaps G1 through G4. For example, the gaps G1 through G4 may be not only shallow trench isolations (STIs) generally used in a device isolation field to define active areas during a semiconductor manufacturing process, but also recess regions of various geometric shapes formed in the surface of the substrate 20. Also, the gaps G1 through G4 may be in forms of vias penetrating a conductive layer located between insulating layers or penetrating an insulating layer located between conductive layers. Also, the gaps G1 through G4 may be formed by partially etching and removing a single layer or multi-layer of specific material layers (not shown) formed in the surface of the substrate 20. The material layer may include, for example, a conductive material, an insulating layer, or a semiconductor material. The gaps G1 through G4 may have cylindrical shapes, but cross-section shapes of the surfaces of the gaps G1 through G4 may be not only circular, but also oval or polygonal, such as triangular, rectangular, or pentagonal. The gaps G1 through G4 may be in shapes of islands having various surface cross-section shapes, but the gaps G1 through G4 may be in shapes of lines on the substrate 20. Also, the gaps G1 through G4 may have vertical profiles having approximately same widths from upper regions that are entrance regions of the gaps G1 through G4 to lower regions thereof, or non-vertical profiles in which horizontal widths W1 through W4 linearly or stepwisely increase or decrease from the upper regions to the lower regions.

Although FIG. 7A illustrates a case where the gaps G1 through G4 are formed in the substrate 20, but in the present specification, a substrate may simply refer only to the substrate 20 or may refer to a substrate having any one of various geometric surface structures before a flowable film 30*b* according to the disclosure is formed thereon. Alternatively, the gaps G1 through G4 may be structures formed as portions of a film deposited on a parallel flat substrate are etched.

Continuously referring to FIG. 7A, the flowable film 30*b* is formed on the exposed surface of the substrate 20 including the gaps G1 through G4. The flowable film 30*b* may include an insulating material film having flowability, for example, a nitride film, an oxide film, or an oxynitride film. When a precursor (for example, a silicon-containing precursor) and a reactant gas (for example, a nitrogen-containing gas) are supplied to a reaction space while applying RF power, plasma is formed inside the reaction space, and a film having flowability, for example, the flowable film 30*b* such as silicon nitride, may be deposited on the exposed surface of the substrate 20 including the gaps G1 through G4 through condensation, oligomerization, and polymerization between the silicon precursor and reactant gas introduced into the reaction space under a plasma atmosphere.

According to embodiments of the disclosure, as shown in FIG. 2, the RF power applied to the reaction space is pulsed and supplied to the reaction space as pulsed plasma in a form of pulsed waves. In detail, as shown in FIG. 2, the RF power applied to the reaction space may have an RF frequency of approximately 5 Hz, and a duty ratio may be approximately 50%. Meanwhile, the pulsed plasma according to embodiments of the disclosure is generated in the reaction space when a plasma reaction apparatus forms pulsed waves of RF power by pulsing the RF power applied to a plasma source or bias electrode region. According to the pulsed plasma, generation and extinction of plasma are repeated by adjusting a plasma-on period and a plasma-off period, thereby controlling a plasma characteristic to be suitable according to a process characteristic.

The pulsed plasma according to embodiments of the disclosure may be provided by using, for example, source pulsing in which the RF power maintains continuous waves in the bias electrode region where a substrate is placed while pulses are applied to the plasma source, bias pulsing in which the RF power maintains continuous waves in the plasma source while pulses are applied to the bias electrode region, or synchronous pulsing in which pulses are applied to both the plasma source and the bias electrode region.

Meanwhile, the reaction space may be, for example, a reaction chamber where a substrate processing method according to embodiments of the disclosure may be performed. In detail, the reaction space may be a plasma reaction chamber where embodiments of the disclosure may be performed. According to some embodiments, the reaction space may be a direct plasma reaction chamber for directly generating plasma near an upper surface of the substrate 20. According to other embodiments, the reaction space may be a remote plasma chamber.

The precursor supplied to the reaction space may be, for example, a silicon-containing precursor, and at least one of aminosilanes, iodosilanes, silicon halides, and an oligomer Si source may be used as a Si source, although not limited thereto. For example, the Si source may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; dimer-trisilylamine; trimer-trisilylamine; tetramer-trisilylamine; pentamer-trisilylamine; hexamer-trisilylamine; heptamer-trisilylamine; and octamer-trisilylamine, or at least one of derivatives or mixtures thereof. The reactant gas may be, for example, a nitrogen-containing gas. Although not limited thereto, the nitrogen-containing gas may include at least one of nitrogen ($N_2$), nitrous oxide ($N_2O$), nitrogen dioxide ($NO_2$), ammonia ($NH_3$), diimide ($N_2H_2$), and hydrazine ($N_2H_4$), at least one of radicals thereof, or at least one of mixtures thereof. In some embodiments, an oxygen-containing gas may be supplied as the reactant gas, and the oxygen-containing gas may include at least one of oxygen ($O_2$), nitrous oxide ($N_2O$), nitrogen dioxide ($NO_2$), ozone ($O_3$), radicals thereof, and mixtures thereof. The precursor and reactant gas may be supplied together with an argon gas as a carrier gas.

Continuously referring to FIG. 7A, the flowable film 30*b* flows down from the upper regions of the gaps G1, G2, G3, and G4 towards the lower regions of the gaps G1, G2, G3, and G4 due to gravity or the like according to the flowability of the flowable film 30*b*, and fills the gaps G1, G2, G3, and G4 from the bottom surfaces of the gaps G1, G2, G3, and G4 in a bottom-up manner. As described above, because the horizontal widths W1 through W4 of the gaps G1 through G4 formed on the surface of the substrate 20 gradually increase (i.e., W1<W2<W3<W4), the amounts of reaction materials that may enter the gaps G1 through G4 increase as the horizontal widths W1 through W4 increase, and thus filling heights of the flowable film 30*b* formed in the gaps G1 through G4 increase from the gap G1 to the gap G4 (i.e., (H1-H711)<(H1-H721)<(H1-H731)<(H1-H741)).

Referring to FIG. 7B, as the gap-fill process further progresses, the flowable film 30*b* further flows down from the upper regions of the gaps G1 through G4 towards the lower regions of the gaps G1 through G4, and continuously fills the gaps G1 through G4 from the bottom surfaces of the gaps G1 through G4 in the bottom-up manner. Meanwhile, as described above, because the horizontal widths W1 through W4 of the gaps G1 through G4 formed on the surface of the substrate 20 gradually increase (i.e., W1<W2<W3<W4), even when the gap-fill process further progresses, the filling heights of the flowable film 30*b* formed in the gaps G1 through G4 may still increase from the gap G1 to the gap G4 (i.e., (H1-H712)<(H1-H722)<(H1-H732)<(H1-H742)). Then, when the gap-fill process further progresses and a sufficient time passes, the gaps G1 through G4 may be completely filled by the flowable film 30*b* in the order from the gap with the largest horizontal width, i.e., in the order from the highest filling height of the flowable film 30*b*. Hereinabove, the size of a gap has been described based on the width in a horizontal direction of the gap, for example, a cross-sectional diameter in the horizontal direction of the gap, but the size of the gap may be compared based on, for example, an internal volume of the gap. In other words, with the increase in the internal volumes of the gaps G1 through G4 formed on the surface of the substrate 20, a filling speed of the flowable film 30*b* formed in the gaps G1 through G4 may also increase.

Referring to FIGS. 7A and 7B, even when a gap-fill process is performed by using a flowable film under a pulsed plasma atmosphere as shown in FIG. 2, filling heights (or filling speeds) of the flowable film filled in gaps may vary depending on sizes of the gaps. In particular, in FIG. 7A, a filling height difference of the flowable film 30*b* between the gap G1 and the gap G4 may be {(H1-H741)−(H1-H711)}, and in FIG. 7B, the filling height difference of the flowable film 30*b* between the gap G1 and the gap G4 may be {(H1-H742)−(H1-H712)}.

Next, a process of filling gaps with a flowable film by using pulsed plasma with the relatively low pulse frequency of FIG. 3 will be described to be compared with the process of filling gaps with a flowable film by using pulsed plasma with the relatively high pulse frequency of FIG. 2 as shown in FIGS. 7A and 7B. Here, in the embodiments of FIGS. 7A and 7B, the relatively high pulse frequency (for example, 5 KHz) of FIG. 2 may be set as an arbitrary reference pulse frequency that may be set according to process requirements in a flowable film gap-fill process according to embodiments of the disclosure, and thus the pulse frequency (for example, 2 KHz) of FIG. 3 that is smaller than the relatively high pulse frequency of FIG. 2 may be referred to as a relatively low pulse frequency. In the present embodiment, for convenience of descriptions, under a premise of pulsed plasma having a same duty ratio (for example, a duty ratio of 50%), the pulse frequency (for example, 2 KHz) of FIG. 3 having a relatively low pulse frequency compared to the pulse frequency (for example, 5 KHz) of FIG. 2 may be assumed as the "relatively low pulse frequency" to describe the gap-fill process using a flowable film.

Figure 8A:
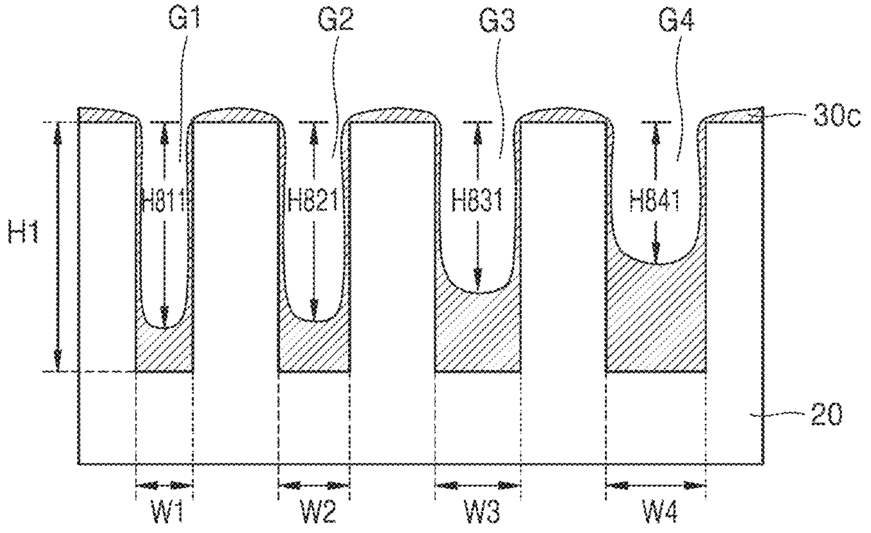
FIGS. 8A and 8B are cross-sectional views schematically showing a process of filling gaps having different sizes with a flowable film by using pulsed plasma with a relatively low pulse frequency.
Figure 8B:
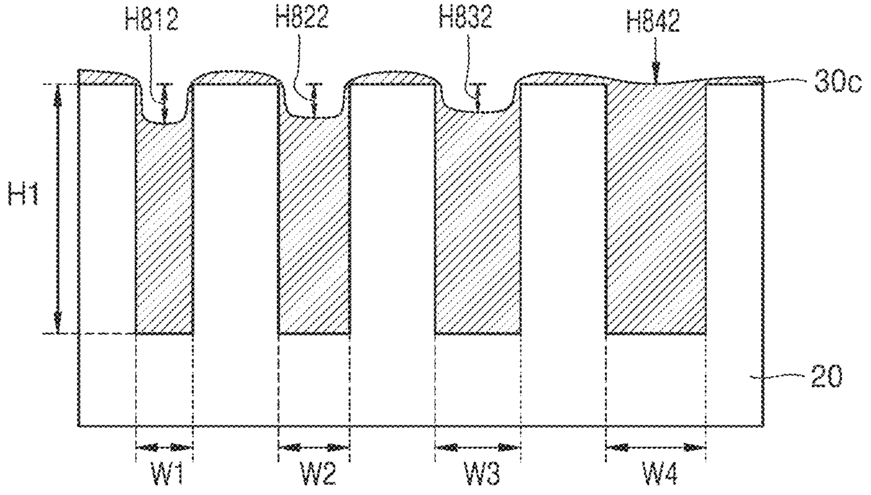

FIGS. 8A and 8B are cross-sectional views schematically showing a process of filling gaps having different sizes with a flowable film by using a pulsed plasma with a relatively low pulse frequency. In FIGS. 8A and 8B, a gap-fill process may be basically performed on gaps having a same size through the same operations as FIGS. 7A and 7B, except that a pulse frequency of RF power for generating a pulsed plasma according to embodiments of the disclosure is lower than the embodiments of FIGS. 7A and 7B. Thus, overlapping descriptions thereof will not be provided again if possible.

Referring to FIG. 8A, the gap structure including the plurality of gaps G1 through G4 having the same vertical depth H1 in the vertical direction and different horizontal widths W1 through W4 in the horizontal direction in partial region of the surface of the substrate 20 on which the gap-fill process is to be performed is illustrated. The horizontal widths W1 through W4 of the plurality of gaps G1 through G4 may gradually increase (i.e., W1<W2<W3<W4). A flowable film 30*c* is formed on an exposed surface of the substrate 20 including the gaps G1 through G4. When a precursor (for example, a silicon-containing precursor) and a reactant gas (for example, a nitrogen-containing gas) are supplied to a reaction space while applying RF power, a plasma is formed inside the reaction space, and the flowable film 30*c* such as silicon nitride, is deposited on the exposed surface of the substrate 20 including the gaps G1 through G4 through condensation, oligomerization, and polymerization between the silicon precursor and reactant gas introduced into the reaction space under a plasma atmosphere.

According to embodiments of the disclosure, as shown in FIG. 3, the RF power applied to the reaction space is pulsed and supplied to the reaction space as pulsed plasma in a form of pulsed waves. In detail, as shown in FIG. 3, the RF power applied to the reaction space may have an RF frequency of approximately 3 Hz, and a duty ratio may be approximately 50%.

Continuously referring to FIG. 8A, the flowable film 30*c* flows down from the upper regions of the gaps G1 through G4 towards the lower regions of the gaps G1 through G4 due to gravity or the like according to flowability of the flowable film 30*c*, and fills the gaps G1 through G4 from the bottom surfaces of the gaps G1 through G4 in a bottom-up manner. As described above, because the horizontal widths W1 through W4 of the gaps G1 through G4 formed on the surface of the substrate 20 gradually increase (i.e., W1<W2<W3<W4), the amounts of reaction materials that may enter the gaps G1 through G4 increase as the horizontal widths W1 through W4 increase, and thus filling heights of the flowable film 30*c* formed in the gaps G1 through G4 increase from the gap G1 to the gap G4 (i.e., (H1−H811)<(H1−H821)<(H1−H831)<(H1−H841)).

Referring to FIG. 8B, as the gap-fill process further progresses, the flowable film 30*c* further flows down from the upper regions of the gaps G1 through G4 towards the lower regions of the gaps G1 through G4, and continuously fills the gaps G1 through G4 from the bottom surfaces of the gaps G1 through G4 in the bottom-up manner. Meanwhile, as described above, because the horizontal widths W1 through W4 of the gaps G1 through G4 formed in the surface of the substrate 20 gradually increase (i.e., W1<W2<W3<W4), even when the gap-fill process further progresses, the filling heights of the flowable film 30*c* formed in the gaps G1 through G4 may still increase from the gap G1 to the gap G4 (i.e., (H1−H812)<(H1−H822)<(H1−H832)<(H1−H842)). Then, when the gap-fill process further progresses and a sufficient time passes, the gaps G1 through G4 may be completely filled by the flowable film 30*c* in the order from the gap with the largest horizontal width, i.e., in the order from the highest filling height of the flowable film 30*c*. Hereinabove, the size of a gap has been described based on the width in a horizontal direction of the gap, for example, a cross-sectional diameter in the horizontal direction of the gap, but the size of the gap may be compared based on, for example, an internal volume of the gap. In other words, with the increase in the internal volumes of the gaps G1 through G4 formed on the surface of the substrate 20, a filling speed of the flowable film 30*c* formed in the gaps G1 through G4 may also increase.

Referring to FIGS. 8A and 8B, even when a gap-fill process is performed by using a flowable film under a pulsed plasma atmosphere as shown in FIG. 3, filling heights (or filling speeds) of the flowable film filled in gaps may vary depending on sizes of the gaps. In particular, in FIG. 8A, a filling height difference of the flowable film 30*c* between the gap G1 and the gap G4 may be {(H1−H841)−(H1−H811)}, and in FIG. 8B, the filling height difference of the flowable film 30*c* between the gap G1 and the gap G4 may be {(H1−H842)−(H1−H812)}.

Comparing FIGS. 7A and 7B using the pulsed plasma with the relatively high pulse frequency with FIGS. 8A and 8B using the pulsed plasma with the relatively low pulse frequency, when a gap-fill process is performed with a flowable film on gaps having different sizes, for example, different widths in a horizontal direction, different cross-sectional diameters in the horizontal direction, or different internal volumes, by using a PECVD process, uniformity of filling heights of the flowable film filled in the gaps may be greater when the pulsed plasma with the relatively low pulse frequency is used than when the pulsed plasma with the relatively high pulse frequency is used ({(H1−H841)−(H1−H811)}<{(H1−H741)−(H1−H711)} or {(H1−H842)−(H1−H812)}<{(H1−H742)−(H1−H712)}). At a same duty ratio, under an atmosphere of the pulsed plasma with the relatively low pulse frequency than the pulsed plasma with the relatively high pulse frequency, a radical-based chemical reaction may further actively occur due to the increase in time during which electron density or radical density is maintained, and thus the pulsed plasma with the relatively low pulse frequency may be more effective in terms of the uniformity of the filling heights of the flowable film. When the radical-based chemical reaction occurs less, generation of oligomer having flowability is slow, and gap pattern dependency of the flowable film filled in the gaps increases, and thus, the uniformity of the filling heights of the flowable film filled in the gaps having various sizes may be low.

Comparing FIGS. 7A through 8B in detail, when the pulsed plasma with the relatively high pulse frequency is used, the filling height difference of the flowable film 30*b* between the gap G1 and the gap G4 may be {(H1−H741)−(H1−H711)} as shown in FIG. 7A at a timepoint T1 when the gap-fill process according to embodiments of the disclosure is progressed to some degree, and the filling height difference of the flowable film 30*b* between the gap G1 and the gap G4 may be {(H1−H742)−(H1−H712)} as shown in FIG. 7B at a timepoint T2 when the gap-fill process is further progressed for a certain period of time. Also, the filling height of the flowable film 30*b* in the gap G1 after the gap-fill process is progressed for a certain period of time T2−T1 increases from (H1−H711) to (H1−H712), and the filling height difference is {(H1−H712)−(H1−H711)}. In addition, the filling height of the flowable film 30*b* in the gap G4 after the gap-fill process is progressed for the certain period of time T2−T1 increases from (H1−H741) to (H1−H742), and the filling height difference is {(H1−H742)−(H1−H741)}.

Meanwhile, when the pulsed plasma with the relatively low pulse frequency is used, the filling height difference of the flowable film 30*c* between the gap G1 and the gap G4 may be {(H1−H841)−(H1−H811)} as shown in FIG. 8A at the timepoint T1 when the gap-fill process according to embodiments of the disclosure is progressed to some degree, and the filling height difference of the flowable film 30*c* between the gap G1 and the gap G4 may be {(H1−H842)−(H1−H812)} as shown in FIG. 8B at the timepoint T2 when the gap-fill process is further progressed fora certain period of time. Also, the filling height of the flowable film 30*c* in the gap G1 after the gap-fill process is progressed for the certain period of time T2−T1 increases from (H1−H811) to (H1−H812), and the filling height difference is {(H1−H812)−(H1−H811)}. In addition, the filling height of the flowable film 30*c* in the gap G4 after the gap-fill process is progressed for the certain period of time T2−T1 increases from (H1−H841) to (H1−H842), and the filling height difference is {(H1−H842)−(H1−H841)}.

When the gap-fill process according to embodiments of the disclosure is performed, the filling height of the flowable film 30*b* in the gap G1 having the smallest horizontal width W1 increases from (H1−H711) to (H1−H712) and the filling height difference thereof is {(H1−H712)−(H1−H711)} after the process time T2−T1 when the pulsed plasma with the relatively high pulse frequency is used. On the other hand, the filling height of the flowable film 30*c* in the gap G1 having the smallest horizontal width W1 increases from (H1–H811) to (H1–H812) and the filling height difference thereof is {(H1–H812)–(H1–H811)} after the same process time T2–T1 when the pulsed plasma with the relatively low pulse frequency is used.

Comparing the both cases, after the same process time T2–T1, the filling height difference of the flowable film 30*b* in the gap G1 having the smallest horizontal width W1 is {(H1–H712)–(H1–H711)} and thus a filling height increase rate thereof is {(H1–H712)–(H1–H711)}/(T2–T1) when the pulsed plasma with the relatively high pulse frequency is used, whereas the filling height difference of the flowable film 30*c* in the gap G1 having the smallest horizontal width W1 is {(H1–H812)–(H1–H811)} and thus a filling height increase rate thereof is {(H1–H812)–(H1–H811)}/(T2–T1) when the pulsed plasma with the relatively low pulse frequency is used. A relationship of the filling height increase rates of the flowable films 30*b* and 30*c* in the two cases is {(H1–H812)–(H1–H811)}/(T2–T1)>{(H1–H712)–(H1–H711)}/(T2–T1). However, after the same process time T2–T1, the filling height difference of the flowable film 30*b* in the gap G4 having the largest horizontal width W4 is {(H1–H742)–(H1–H741)} and thus a filling height increase rate thereof is {(H1–H742)–(H1–H741)}/(T2–T1) when the pulsed plasma with the relatively high pulse frequency is used, and the filling height difference of the flowable film 30*c* in the gap G4 having the largest horizontal width W4 is {(H1–H842)–(H1–H841)} and thus a filling height increase rate thereof is {(H1–H842)–(H1–H841)}/(T2–T1) when the pulsed plasma with the relatively low pulse frequency is used. A relationship of the filling height increase rates of the flowable films 30*b* and 30*c* in the two cases is {(H1–H842)–(H1–H841)}/(T2–T1)<{(H1–H742)–(H1–H741)}/(T2–T1).

In other words, during a same gap-fill process time, a filling height increase rate of a flowable film may relatively increase when the pulsed plasma with the relatively low pulse frequency is used compared to when the pulsed plasma with the relatively high pulse frequency is used in a gap having a relatively small size, for example, in the gap G1 having the smallest horizontal width W1, but the filling height increase rate of the flowable film may relatively decrease when the pulsed plasma with the relatively low pulse frequency is used compared to when the pulsed plasma with the relatively high pulse frequency is used in a gap having a relatively large size, for example, in the gap G4 having the largest horizontal width W4. Accordingly, during the same gap-fill process time, when the pulsed plasma with the relatively low pulse frequency is used, the filling height increase rate of the flowable film relatively increases in the gap having the relatively small size but relatively decreases in the gap having the relatively large size, compared to when the pulsed plasma with the relatively high pulse frequency is used. In summary, filling height uniformity of a flowable film in gaps increases when the pulsed plasma with the relatively low pulse frequency is used compared to when the pulsed plasma with the relatively high pulse frequency is used.

Accordingly, for example, when ending of the gap-fill process is set based on a filling height in a gap having a relatively large size, for example, a relatively large cross-sectional diameter, a difference of a filling height between a gap having the largest cross-sectional diameter and a gap having the smallest cross-sectional diameter is relatively small when the pulsed plasma with the relatively low pulse frequency is used compared to when the pulsed plasma with the relatively high pulse frequency is used, and thus a gap-fill process time may be reduced by a time corresponding to the difference. Similarly, a difference of a filling speed between the gap having the largest cross-sectional diameter and the gap having the smallest cross-sectional diameter is relatively small when the pulsed plasma with the relatively low pulse frequency is used compared to when the pulsed plasma with the relatively high pulse frequency is used, and thus the gap-fill process time may be reduced by a time corresponding to the difference. Also, with the decrease in the gap-fill process time, excessive deposition of a flowable film as a gap-fill material may decrease around the gap having the largest cross-sectional diameter or largest internal volume, and accordingly, a time for a surface planarization process, such as an etch-back or chemical mechanical polishing process, performed subsequently may decrease correspondingly, and moreover, consumption of the flowable film that is excessively deposited may decrease.

Here, a filling speed of a flowable film denotes a changing rate of a filling rate of a flowable film filled in a gap having specific volume, and a filling height increase rate of a flowable film denotes a changing rate of a filling height increase of a flowable film from a bottom surface of a gap in the gap having a specific height.

Meanwhile, the phrase "a filling speed of a flowable film relatively increases (or decreases)" may include following two meanings.

First, based on a same process time, for example, the filling speed of the flowable film 30*b* (FIGS. 7A and 7B) in the gap G1 having the smallest cross-sectional diameter or the gap G4 having the largest cross-sectional diameter may relatively increase (or decrease) compared to the filling speed of the flowable film 30*c* (FIGS. 8A and 8B). In other words, the filling speeds of the flowable films in the gap G1 or G4 are compared in cases where the pulsed plasma with the relatively high pulse frequency is used and where the pulsed plasma with the relatively low pulse frequency is used.

Accordingly, based on the results of FIGS. 7A through 8B, in the gap G1 having a relatively small size, a filling speed of a flowable film when pulsed plasma with a relatively low pulse frequency is used may relatively increase (or may be greater) compared to a filling speed of a flowable film when pulsed plasma with a relatively high pulse frequency is used, but in the gap G4 having a relatively large size, the filling speed of the flowable film when the pulsed plasma with the relatively low pulse frequency is used may relatively decrease (or may be less) compared to the filling speed of the flowable film when the pulsed plasma with the relatively high pulse frequency is used.

Second, referring to FIGS. 8A and 8B, based on a same process time, for example, a filling speed of a flowable film in the gap G1 having a relatively small cross-sectional diameter may relatively increase (or decrease) compared to an arbitrary first reference filling speed, and the filling speed of the flowable film in the gap G4 having a relatively large cross-sectional diameter may relatively increase (or decrease) compared to an arbitrary second reference filling speed.

Here, a filling speed of a flowable film in a gap denotes a degree of filling rate of a flowable film filled in a gap during a gap-fill process according to the disclosure, based on entire volume of the gap. For example, a filling rate may be 100% when the gap is completely filled, and may be 50% when the gap is half filled, and thus the filling speed of the flowable film may be the filling rate compared to a process time of the gap-fill process.

Also, the arbitrary first reference filling speed and the arbitrary second reference filling speed both denote virtual filling speeds that are references of all comparisons. A virtual reference of a flowable film in the gap G1 having a relatively small cross-sectional diameter may be defined as the arbitrary first reference filling speed, and a virtual reference of a flowable film in the gap G4 having a relatively large cross-sectional diameter may be defined as the arbitrary second reference filling speed.

For example, when a gap-fill process without a difference in a filling height between gaps is performed, a filling speed in the small gap G1 may be referred to as the first reference filling speed and a filling speed in the large gap G4 may be referred to as the second reference filling speed. Accordingly, in FIGS. 8A and 8B using the pulsed plasma with the relatively low pulse frequency, a degree to which the filling speed of the flowable film in the small gap G1 is greater than (or less than) the first reference filling speed, and a degree to which the filling speed of the flowable film in the large gap G4 is greater than (or less than) the second reference filling speed are relatively compared.

According to embodiments of the disclosure, uniformity of filling degrees of a flowable film filled in gaps may be increased by reducing a difference between a filling speed of a flowable film in a gap (for example, the gap G1) having a relatively small cross-sectional diameter and a filling speed of a flowable film in a gap (for example, the gap G4) having a relatively large cross-sectional diameter. In this regard, the filling speed of the flowable film in the gap G1 may be relatively increased (for example, compared to the first reference filling speed) and the filling speed of the flowable film in the gap G4 may be relatively decreased (for example, compared to the second reference filling speed). Accordingly, when a gap-fill process according to the embodiments of the disclosure is performed on a substrate having a surface on which multiple gaps having various cross-sectional diameters are formed, an error occurring in achieving a target of the gap-fill process may be reduced as a difference of filling speeds of a flowable film in the various gaps is reduced, a time for filling the gaps may be reduced, and excessive deposition of the flowable film as a gap-fill material may be reduced.

Meanwhile, the phrase "a filling height increase rate of a flowable film may relatively increase (or decrease)" may also include following two meanings.

First, based on a same process time, for example, the filling height increase rate of the flowable film 30*b* (FIGS. 7A and 7B) in the gap G1 having the smallest cross-sectional diameter or the gap G4 having the largest cross-sectional diameter may relatively increase (or decrease) compared to the filling height increase rate of the flowable film 30*c* (FIGS. 8A and 8B). In other words, the filling height increase rates of the flowable films in the gap G1 or G4 are compared in cases where the pulsed plasma with the relatively high pulse frequency is used and where the pulsed plasma with the relatively low pulse frequency is used.

Accordingly, based on the results of FIGS. 7A through 8B, in the gap G1 having a relatively small size, a filling height increase rate of a flowable film when pulsed plasma with a relatively low pulse frequency is used may relatively increase (or may be greater) compared to a filling height increase rate of a flowable film when pulsed plasma with a relatively high pulse frequency is used, but in the gap G4 having a relatively large size, the filling height increase rate of the flowable film when the pulsed plasma with the relatively low pulse frequency is used may relatively decrease (or may be less) compared to the filling height increase rate of the flowable film when the pulsed plasma with the relatively high pulse frequency is used.

Second, referring to FIGS. 8A and 8B, based on a same process time, for example, a filling height increase rate of a flowable film in the gap G1 having a relatively small cross-sectional diameter may relatively increase (or decrease) compared to an arbitrary first reference filling height increase rate that is a reference in the gap-fill process according to the disclosure, and the filling height increase rate of the flowable film in the gap G4 having a relatively large cross-sectional diameter also may relatively increase (or decrease) compared to an arbitrary second reference filling height increase rate that is a reference in the gap-fill process according to the disclosure. In other words, in FIGS. 8A and 8B using the pulsed plasma with the relatively low pulse frequency, a degree to which the filling height increase rate of the flowable film in the small gap G1 is greater than (or less than) the first reference filling height increase rate, and a degree to which the filling height increase rate of the flowable film in the large gap G4 is greater than (or less than) the second reference filling height increase rate are relatively compared.

According to embodiments of the disclosure, uniformity of thicknesses of a flowable film filled in gaps may be increased by reducing a difference between a filling height increase rate of a flowable film in a gap (for example, the gap G1) having a relatively small cross-sectional diameter and a filling height increase rate of a flowable film in a gap (for example, the gap G4) having a relatively large cross-sectional diameter. In this regard, the filling height increase rate of the flowable film in the gap G1 may be relatively increased (for example, compared to the first reference filling height increase rate) and the filling height increase rate of the flowable film in the gap G4 may be relatively decreased (for example, compared to the second reference filling height increase rate). Accordingly, when a gap-fill process is performed on a substrate having a surface on which multiple gaps having various cross-sectional diameters are formed, an error occurring in achieving a target of the gap-fill process may be reduced as a difference of filling height increase rates of a flowable film in the various gaps is reduced, a time for the gap-fill process may be reduced, and excessive deposition of the flowable film as a gap-fill material may be reduced.

Meanwhile, FIG. 4A is a schematic diagram for describing pulsed mode plasma with a relatively low duty ratio and high pulse frequency used in a PECVD process. Comparing FIG. 4A with FIG. 2, a duty ratio is decreased from 50% to 30%, and a pulse frequency is the same as the pulse frequency of FIG. 2, for example, 5 KHz. FIG. 4B is a schematic diagram for describing pulsed mode plasma with a relatively low duty ratio and low pulse frequency used in a PECVD process. Comparing FIG. 4B with FIG. 3, a duty ratio is decreased from 50% to 30%, and a pulse frequency is the same as the pulse frequency of FIG. 3, for example, 2 KHz.

Referring to FIGS. 4A and 4B, FIG. 4A corresponds to a case using the pulsed plasma with the relatively high pulse frequency and FIG. 4B corresponds to a case using the pulsed plasma with the relatively low pulse frequency, except that the duty ratio is set to 30%, in comparison with FIGS. 2 and 3. Accordingly, a gap-fill process according to embodiments of the disclosure may be performed based on FIGS. 4A and 4B.

Hereinafter, process conditions for performing a gap-fill process according to embodiments of the disclosure are arranged in Table 1 below.

TABLE 1

| Process Variable | Deposition Step |
|---|---|
| Time (sec) | 1 to 1,800 |
| Pressure (Torr) | 1 to 10 |
| Process Gas Injection | ON |
| RF Power (W) | 50 to 1,000 |
| Duty Ratio (%) | 1 to 99 |
| Pulse Frequency (Hz) | 500 to 100,000 |
| Temperature (° C.) | 0 < T < 150 |

Figure 9:
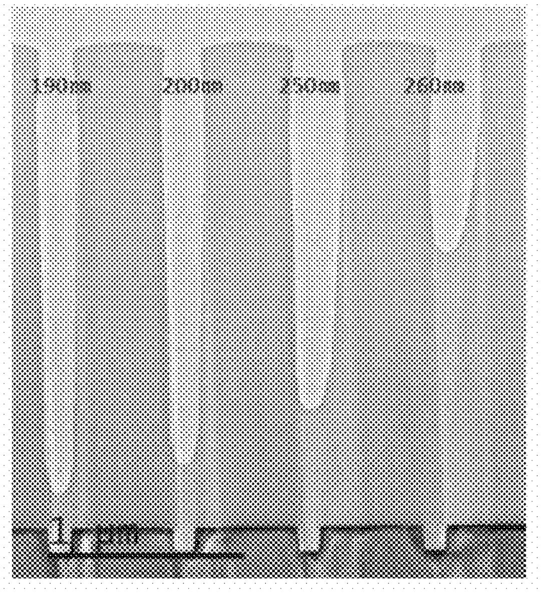
FIG. 9 is a transmission electron microscope (TEM) image showing a flowable film formed in a gap by using continuous plasma.
Figure 10:
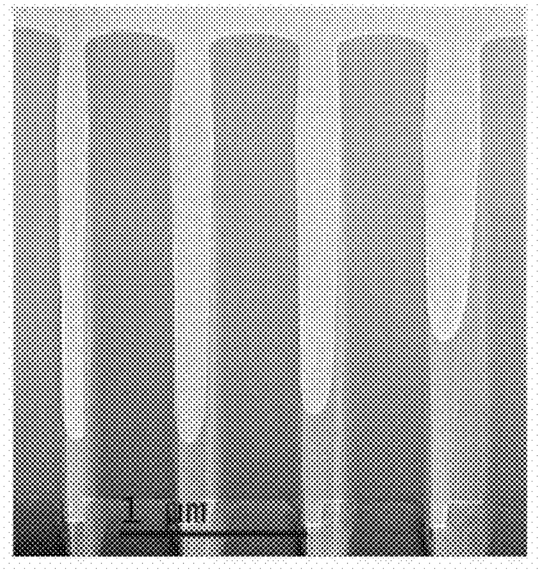
FIG. 10 is a TEM image showing a flowable film formed in a gap by using pulsed plasma with a relatively high pulse frequency.
Figure 11:
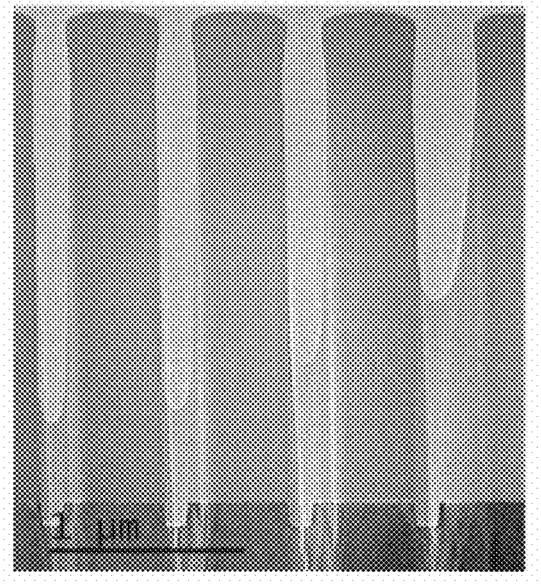
FIG. 11 is a TEM image showing a flowable film formed in a gap by using pulsed plasma with a relatively low pulse frequency.

FIG. 9 is a transmission electron microscope (TEM) image showing a flowable film formed in a gap by using a continuous wave plasma. FIG. 10 is a TEM image showing a flowable film formed in a gap by using a pulsed plasma with a relatively high pulse frequency. FIG. 11 is a TEM image showing a flowable film formed in a gap by using a pulsed mode plasma with a relatively low pulse frequency.

FIGS. 9 through 11 are all images showing results of performing a gap-fill process with a flowable film, for example, a silicon nitride film, during a same process time. The gap-fill process is performed for tens to hundreds of seconds, for example, about 180 seconds, and FIGS. 9 through 11 show results of performing the gap-fill process on gaps having different critical dimension (CD) sizes. The CD sizes of the gaps are 190 nm, 200 nm, 250 nm, and 260 nm, and depths of the gaps are about 2.5 μm. In FIGS. 10 and 11, a duty ratio is 50%, a pulse frequency of RF power in FIG. 10 is 5 KHz, and a pulse frequency of RF power in FIG. 11 is 1 KHz.

Table 2 below shows, in percentages, relative heights of flowable films formed in gaps according to CDs as shown in FIGS. 9 to 11, based on the height of a flowable film in which a CD is the largest (260 nm).

TABLE 2

| CD Size (nm) | Continuous Plasma (%) | Low Duty Ratio, High Frequency (%) | Low Duty Ratio, Low Frequency (%) |
|---|---|---|---|
| 190 | 19.8 | 44.3 | 44.1 |
| 200 | 29.0 | 45.3 | 52.2 |
| 250 | 46.8 | 60.2 | 71.6 |
| 260 | 100.0 | 100.0 | 100.0 |

Figure 12:
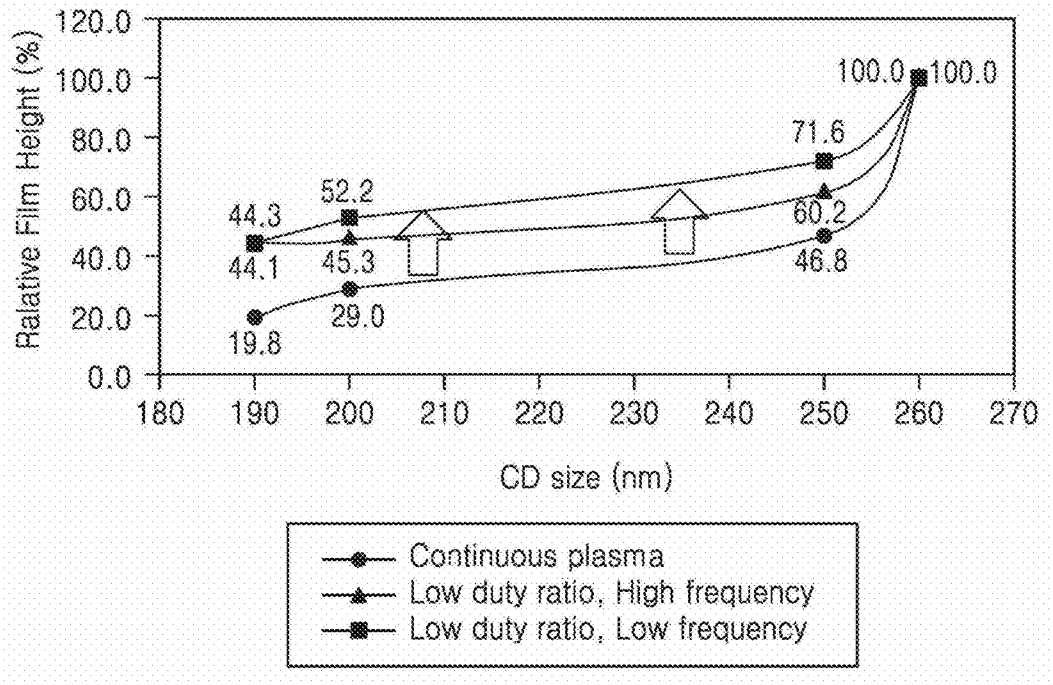
FIG. 12 is a graph in which the height of a flowable film formed in a gap according to critical dimension (CD) sizes is compared with the related art, according to embodiments of the disclosure.

FIG. 12 is a graph in which the height of a flowable film formed in a gap according to CD sizes is compared with the related art, according to embodiments of the disclosure, wherein data of Table 2 is shown in a graph. A horizontal axis indicates a CD size and a vertical axis indicates a relative height of a flowable film.

Referring to the graph of FIG. 12, it is observed that a difference between the greatest height and the smallest height of flowable films in a condition of continuous plasma of FIG. 9 is about 5 times, but a difference between the greatest height and the smallest height of flowable films in a condition of pulsed plasma of FIGS. 10 and 11 is reduced to about 2.3 times respectively. In a condition of pulsed plasma having a same duty ratio, uniformity of heights of a flowable film is higher in a condition of pulsed plasma with a relatively low pulse frequency of FIG. 11 than in a condition of pulsed plasma with a relatively high pulse frequency of FIG. 10. In particular, when a CD size is 200 nm or greater, the uniformity of the heights of the flowable film may be higher in the condition of pulsed plasma with the relatively low pulse frequency.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:

providing, in a reaction space, a substrate having a surface on which a first gap and a second gap are formed, wherein the first gap has a first cross-sectional diameter in a horizontal direction, and the second gap has a second cross-sectional diameter greater than the first cross-sectional diameter, in the horizontal direction; and filling the first gap and the second gap with a flowable film under a pulsed plasma atmosphere, while supplying a precursor and a reactant gas to the reaction space, wherein the filling comprises:

setting a reference pulse frequency that is an arbitrary reference of pulsed plasma; and filling the first gap and the second gap with the flowable film while supplying the pulsed plasma with an execution pulse frequency smaller than the reference pulse frequency, wherein, by performing the filling while supplying the pulsed plasma with the execution pulse frequency smaller than the reference pulse frequency, a filling height increase rate of the flowable film in the first gap relatively increases and at the same time, a filling height increase rate of the flowable film in the second gap relatively decreases so that a height difference between a filling height of the flowable film filled in the first gap and a filling height of the flowable film filled in the second gap is decreased relative to a height difference of another flowable film deposited using the reference pulse frequency.

2. The substrate processing method of claim 1, wherein, by performing the filling while supplying the pulsed plasma with the execution pulse frequency smaller than the reference pulse frequency, a filling speed of the flowable film in the first gap relatively increases and at the same time, a filling speed of the flowable film in the second gap relatively decreases so that a difference between the filling speed of the flowable film filled in the first gap and the filling speed of the flowable film filled in the second gap is decreased relative to a filling speed difference of another flowable film deposited using the reference pulse frequency.

3. The substrate processing method of claim 1, wherein an internal volume of the first gap is smaller than an internal volume of the second gap.

4. The substrate processing method of claim 1, wherein the execution pulse frequency is within a range between about 0.5 KHz and about 100 KHz.

5. The substrate processing method of claim 1, wherein a duty ratio of the pulsed plasma is within a range between about 1% and about 99%.

6. The substrate processing method of claim 1, wherein vertical depths of the first gap and the second gap are within a range between about 100 nm and about 5,000 nm, and horizontal widths of the first gap and the second gap are within a range between about 50 nm and about 1,000 nm.

7. The substrate processing method of claim 5, wherein magnitudes of the reference pulse frequency and the execution pulse frequency are compared based on the pulsed plasma having a same duty ratio.

8. The substrate processing method of claim 1, wherein pressure of the reaction space during the filling of the first gap and the second gap with the flowable film is within a range from about 1 Torr to about 10 Torr.

9. The substrate processing method of claim 1, wherein the filling of the first gap and the second gap with the flowable film is performed at a process temperature between about 0° C. and about 150° C.

10. The substrate processing method of claim 1, wherein the precursor supplied to the reaction space comprises a silicon-containing precursor and the reactant gas comprises a nitrogen-containing gas.

11. The substrate processing method of claim 10, wherein the nitrogen-containing gas comprises at least one of nitrogen ($N_2$), nitrous oxide ($N_2O$), nitrogen dioxide ($NO_2$), ammonia ($NH_3$), diimide ($N_2H_2$), hydrazine ($N_2H_4$) radicals thereof, and mixtures thereof.

12. The substrate processing method of claim 10, wherein the silicon precursor comprises at least one of aminosilanes, iodosilanes, silicon halides, and an oligomer silicon (Si) source, or at least one of mixtures thereof.

13. The substrate processing method of claim 10, wherein the silicon precursor comprises at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N$ (iPr); DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2$ $(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; dimer-trisilylamine; trimer-trisilylamine; tetramer-trisilylamine; pentamer-trisilylamine; hexamer-trisilylamine; heptamer-trisilylamine; and octamer-trisilylamine, or at least one of derivatives or mixtures thereof.

14. The substrate processing method of claim 1, wherein a film to be formed in the first gap and the second gap comprises at least one of silicon oxide, silicon nitride, silicon oxynitride, silicon carbonitride and mixtures thereof.

15. The substrate processing method of claim 1, wherein the reactant gas supplied to the reaction space comprises an oxygen-containing gas, and the oxygen-containing gas comprises at least one of oxygen ($O_2$), nitrous oxide ($N_2O$), nitrogen dioxide ($NO_2$), ozone ($O_3$), radicals thereof, and mixtures thereof.

16. A substrate processing method comprising:

providing, in a reaction space, a substrate including at least two gaps in a surface thereof;

filling the at least two gaps with a flowable film under a pulsed plasma atmosphere, while supplying a precursor and a reactant gas to the reaction space, and adjusting a pulse frequency of pulsed plasma, wherein the adjusting of the pulse frequency of the pulsed plasma comprises:

setting a reference pulse frequency that is an arbitrary reference of the pulsed plasma; and setting an execution pulse frequency smaller than the reference pulse frequency, and wherein the difference of the filling heights of the flowable film filled in the at least two gaps, between the at least two gaps, is reduced, relative to a height difference of another flowable film deposited using the reference pulse frequency, while supplying the pulsed plasma with the execution pulse frequency.

17. The substrate processing method of claim 16, wherein the at least two gaps comprise a first gap and a second gap, wherein the first gap has a first cross-sectional diameter in a horizontal direction, and the second gap has a second cross-sectional diameter greater than the first cross-sectional diameter, in the horizontal direction.

18. The substrate processing method of claim 16, wherein the execution pulse frequency is within a range between about 0.5 KHz and about 100 KHz.

19. The substrate processing method of claim 16, wherein vertical heights of the at least two gaps are within a range between about 100 nm and about 5,000 nm, and horizontal widths of the at least two gaps are within a range between about 50 nm and about 1,000 nm.

20. The substrate processing method of claim 16, wherein magnitudes of the reference pulse frequency and the execution pulse frequency are compared based on the pulsed plasma having a same duty ratio.

21. The substrate processing method of claim 16, wherein the precursor supplied to the reaction space comprises a silicon-containing precursor and the reactant gas comprises a nitrogen-containing gas.

22. A substrate processing method comprising:

providing, in a reaction space, a substrate including at least two gaps in a surface thereof; and filling the at least two gaps with a flowable film under a pulsed plasma atmosphere, while supplying a precursor and a reactant gas to the reaction space, wherein a difference of filling heights of the flowable film filled in the at least two gaps, between the at least two gaps, is reduced, relative to a height difference of another flowable film deposited using the reference pulse frequency, by adjusting a pulse frequency of pulsed plasma, wherein the adjusting of the pulse frequency of the pulsed plasma comprises:

setting a reference pulse frequency that is an arbitrary reference of the pulsed plasma; and setting an execution pulse frequency smaller than the reference pulse frequency, wherein a difference of filling speeds of the flowable film filled in the at least two gaps, between the at least two gaps, is reduced while supplying the pulsed plasma with the execution pulse frequency.

23. The substrate processing method of claim 22, wherein the at least two gaps comprise a first gap and a second gap, wherein the first gap has a first cross-sectional diameter in a horizontal direction, and the second gap has a second cross-sectional diameter greater than the first cross-sectional diameter, in the horizontal direction.

24. The substrate processing method of claim 23, wherein an internal volume of the first gap is smaller than an internal volume of the second gap.

* * * * *